(12) United States Patent
Lee

(10) Patent No.: US 8,810,281 B2
(45) Date of Patent: Aug. 19, 2014

(54) SENSE AMPLIFIERS INCLUDING BIAS CIRCUITS

(75) Inventor: Seong-Hoon Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/191,263

(22) Filed: Jul. 26, 2011

(65) Prior Publication Data

US 2013/0027133 A1    Jan. 31, 2013

(51) Int. Cl.
*G01R 19/00* (2006.01)
(52) U.S. Cl.
USPC ............... 327/55; 327/53; 327/66; 327/67
(58) Field of Classification Search
USPC ......... 327/55, 54, 53, 52, 65, 66, 67, 51, 530, 327/538, 539, 543, 57, 199, 200, 208, 210, 327/215, 217, 219, 222
See application file for complete search history.

(56) References Cited

U.S. PATENT DOCUMENTS

| | | | |
|---|---|---|---|
| 4,284,957 A | 8/1981 | Haque | |
| 4,502,020 A | 2/1985 | Nelson et al. | |
| 4,555,673 A | 11/1985 | Huijsing et al. | |
| 4,586,166 A | 4/1986 | Shah | |
| 4,792,923 A | 12/1988 | Nakase et al. | |
| 4,837,523 A | 6/1989 | Wright | |
| 4,843,343 A | 6/1989 | Pace | |
| 5,473,567 A | 12/1995 | McClure | |
| 5,477,497 A | 12/1995 | Park et al. | |
| 5,489,874 A | 2/1996 | Tanoi | |
| 5,493,533 A | 2/1996 | Lambrache | |
| 5,504,442 A | 4/1996 | Tanoi | |
| 5,514,986 A | 5/1996 | Tanoi | |
| 5,654,928 A | 8/1997 | Lee et al. | |
| 5,710,739 A | 1/1998 | Calligaro et al. | |
| 5,815,451 A | 9/1998 | Tsuchida | |
| 5,949,730 A | 9/1999 | Shirley et al. | |
| 6,127,853 A | 10/2000 | Yu | |
| 6,141,246 A | 10/2000 | Derman et al. | |
| 6,191,989 B1 | 2/2001 | Luk et al. | |
| 6,271,977 B1 | 8/2001 | Chung et al. | |
| 6,292,417 B1 | 9/2001 | Seyyedy | |
| 6,326,815 B1 | 12/2001 | Sim et al. | |
| 6,396,310 B2 | 5/2002 | Shin | |
| 6,456,161 B2 | 9/2002 | Smith | |
| 6,466,499 B1 | 10/2002 | Blodgett | |
| 6,483,351 B2 | 11/2002 | Sim | |
| 6,483,353 B2 | 11/2002 | Kim et al. | |
| 6,617,885 B2 * | 9/2003 | Lim et al. | 327/57 |
| 6,721,218 B2 | 4/2004 | Lim | |
| 6,738,302 B1 | 5/2004 | Parris et al. | |
| 6,750,714 B1 | 6/2004 | McIntyre | |
| 6,798,250 B1 | 9/2004 | Wile | |
| 6,831,503 B2 * | 12/2004 | La Rosa | 327/541 |
| 6,870,425 B2 | 3/2005 | Leifso et al. | |
| 6,879,217 B2 | 4/2005 | Visocchi | |
| 6,879,533 B2 | 4/2005 | Chae et al. | |
| 6,894,564 B1 | 5/2005 | Gilbert | |

(Continued)

*Primary Examiner* — Lincoln Donovan
*Assistant Examiner* — Jung H. Kim
(74) *Attorney, Agent, or Firm* — Dorsey & Whitney LLP

(57) ABSTRACT

Sense amplifiers including bias circuits are described. Examples include bias circuits having an adjustable width transistor. A loop gain of the bias circuit may be determined in part by the adjustable width of the transistor. Examples of sense amplifiers including amplifier stages configured to bias an input/output node to a reference voltage.

25 Claims, 7 Drawing Sheets

(56) References Cited

U.S. PATENT DOCUMENTS

| | | |
|---|---|---|
| 6,944,066 B1 | 9/2005 | Jing |
| 7,038,963 B2 | 5/2006 | Lee |
| 7,075,368 B2 | 7/2006 | Lin et al. |
| 7,154,331 B2 | 12/2006 | Zaguri |
| 7,154,923 B2 | 12/2006 | Kucharski |
| 7,218,166 B2 | 5/2007 | Yanagisawa et al. |
| 7,262,638 B2 | 8/2007 | Shim |
| 7,265,620 B2 | 9/2007 | Liu et al. |
| 7,286,011 B2 | 10/2007 | Chang et al. |
| 7,286,425 B2 | 10/2007 | Barth, Jr. |
| 7,342,451 B2 | 3/2008 | Brueske |
| 7,368,991 B2 | 5/2008 | Swanson |
| 7,446,609 B2 | 11/2008 | Lee et al. |
| 7,477,076 B2 | 1/2009 | Miyatake |
| 7,521,992 B1 | 4/2009 | Hagleitner et al. |
| 7,564,295 B2 | 7/2009 | Ker et al. |
| 7,629,817 B2 | 12/2009 | Nedovic et al. |
| 7,777,568 B2 | 8/2010 | Lim |
| 7,786,764 B2 | 8/2010 | Cheng |
| 7,813,199 B2 | 10/2010 | Morgan |
| 7,889,006 B1 | 2/2011 | Jones |
| 7,956,641 B1 | 6/2011 | Peng et al. |
| 7,990,792 B2 | 8/2011 | Abe et al. |
| 8,030,972 B2 * | 10/2011 | Jansson ........................... 327/54 |
| 8,049,535 B2 | 11/2011 | Van Tran et al. |
| 8,283,950 B2 | 10/2012 | Willey |
| 8,289,796 B2 * | 10/2012 | Lee ................................ 365/207 |
| 8,344,806 B1 | 1/2013 | Franck et al. |
| 8,472,898 B2 | 6/2013 | Rofougaran |
| 2003/0179842 A1 | 9/2003 | Kane et al. |
| 2006/0220459 A1 | 10/2006 | Kulasekeram |
| 2006/0273831 A1 | 12/2006 | Maksimovic et al. |
| 2009/0267668 A1 | 10/2009 | Lin |
| 2011/0182129 A1 | 7/2011 | Lee |
| 2011/0235450 A1 | 9/2011 | Lee et al. |
| 2012/0038405 A1 | 2/2012 | Willey |
| 2012/0326786 A1 | 12/2012 | Willey |
| 2013/0009705 A1 * | 1/2013 | Lee ................................ 330/261 |
| 2013/0015899 A1 | 1/2013 | Willey |

* cited by examiner

SENSE AMPLIFIERS INCLUDING BIAS CIRCUITS

TECHNICAL FIELD

Embodiments of the invention relate generally to integrated circuits, and more particularly, in one or more of the illustrated embodiments, to integrated circuit sense amplifiers.

BACKGROUND

Current mode sense amplifiers (CSAs) have been used in integrated circuits to sense and amplify differential input currents. For example, in applications in semiconductor memory, the CSAs are often used to sense and amplify input currents resulting from reading memory cell data and being provided over relatively long signal lines. As a result, the input currents may be very weak and low in magnitude. In applications such as these, control of the CSA's loop gain may be important because it affects the operating characteristics of the CSA. That is, where the loop gain of a CSA is approximately equal to 1, the dominant mode of operation for the CSA is sensing differential input currents. In contrast, as the loop gain of a CSA increases to be greater than 1, the dominant mode of operation for the CSA transitions from current sensing to behaving as a latch circuit. Thus, controlling loop gain may be desirable in order to control the behavior of the CSA.

FIG. 1A illustrates a conventional current mode sense amplifier (CSA) 100. The CSA 100 includes a pair of cross coupled n-type field effect transistors (n-FETs) 102, 104 (e.g. n-channel metal-oxide semiconductor transistors (NMOS)) and diode coupled n-FET transistors 108, 110. n-FET bias transistors 112, 114 are coupled to the n-FET transistors 102, 104 and biased by a bias voltage $V_{bias}$. Differential input currents are applied to the input-output nodes IO, IOb to be sensed and amplified by the CSA 100. As known, the loop gain of the CSA 100 is $g_m R$, where gm is the transconductance of n-FET transistors 102, 104 and R is the load provided by the n-FET transistors 108, 110. As also known, the load for the diode coupled n-FET transistors 108, 110 is $1/g_m$. As a result, the loop gain for the CSA 100 is approximately 1, and the loop gain remains substantially constant despite variations in factors affecting gm, such as process, voltage, and temperature (PVT). Although the CSA 100 may have the benefit of a being able to maintain a substantially constant loop gain for changes in PVT, for operation a supply voltage Vcc for the CSA 100 should be greater than the sum of the threshold voltages of the transistors 102 (or 104) and transistors 108 (or 110), and a voltage margin for operation. In low voltage, low power systems, however, providing a supply voltage of this level is not desirable.

FIG. 1B illustrates another conventional CSA 150. The CSA 150 includes cross coupled n-FET transistors 102, 104 and bias transistors 112, 114, as in the CSA 100. However, the diode coupled n-FET transistors 108, 110 of the CSA 100 have been replaced by p-type field effect transistors (p-FETs) 158, 160 to provide load R. An advantage of the CSA 150 over the CSA 100 may be that a Vcc can be less than that for CSA 100. The Vcc only needs to be greater than the threshold voltage of the transistors 102 (or 104) plus a voltage margin, which is one transistor threshold voltage less than for the CSA 100. As with CSA 100, the loop gain of the CSA 150 is $g_m R$. In contrast to the diode coupled n-FET transistors 108, 110, the load provided by the p-FET transistors 158, 160 are not correlated with $g_m$. As a result, the loop gain for the CSA 150 may vary more than the loop gain for the CSA 100 of FIG. 1 would vary with variations in PVT. As previously discussed, a greater variance of loop gain may cause the CSA's operating characteristics to vary greater with PVT as well, which is typically an undesirable situation.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
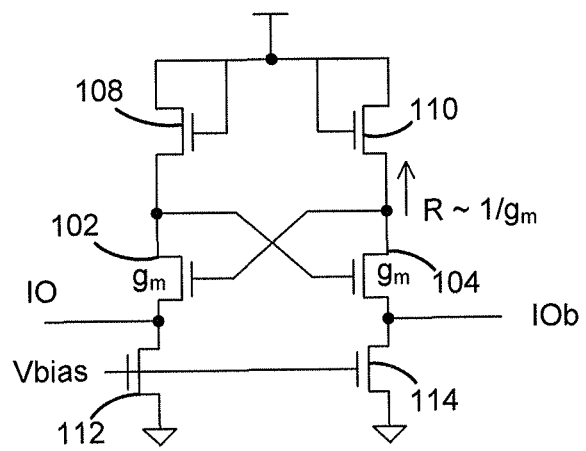
FIG. 1A is an example of a conventional current mode sense amplifier.
Figure 1B:
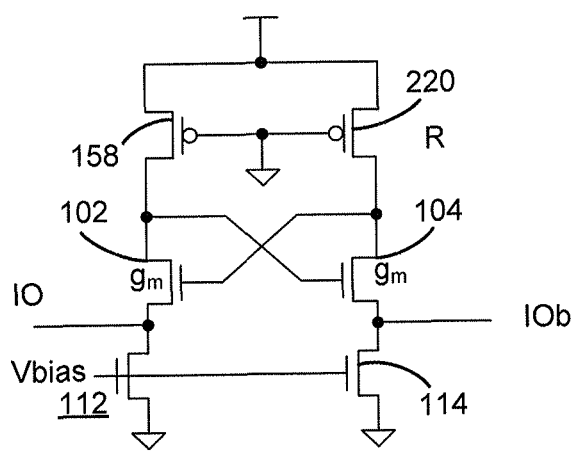
FIG. 1B is another example of a conventional current mode sense amplifier.
Figure 2:
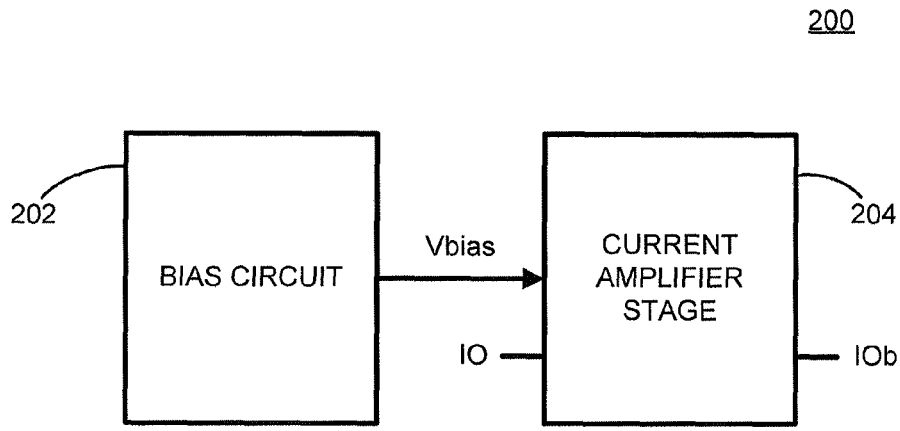
FIG. 2 is a schematic illustration of a sense amplifier.

Examples of sense amplifiers have been described in co-pending application U.S. Ser. No. 12/694,136, filed Jan. 26, 2010 entitled "Sense amplifier having loop gain control." FIG. 2 is a schematic illustration of a sense amplifier 200. The sense amplifier includes a bias circuit 202 and an amplifier stage 204. A bias voltage Vbias provided by the bias circuit 202 may adjust to accommodate a constant loop gain. The bias circuit 202 may provide the Vbias voltage to the amplifier stage 204, which is configured to sense input current and amplify the same at the input/output of the amplifier stage 204 (e.g. nodes IO and IOb). Recall the IO, IOb nodes may be coupled to relatively long interconnects. The loop gain of the amplifier stage 204 may be controlled at least in part by the Vbias voltage from the bias circuit 202, for example, to control the loop gain so that it is generally independent of process, voltage, and/or temperature variations. Additionally, operation of the amplifier stage 204 can be affected by changes to loop gain. For example, when the loop gain of the amplifier stage is approximately 1, the amplifier stage is sensitive to a current differential at the input/output. As the loop gain of the amplifier stage increases from 1, the behavior of the amplifier stage may change, having less sensitivity to an input current differential and behaving more as a latch circuit.

Figure 3:
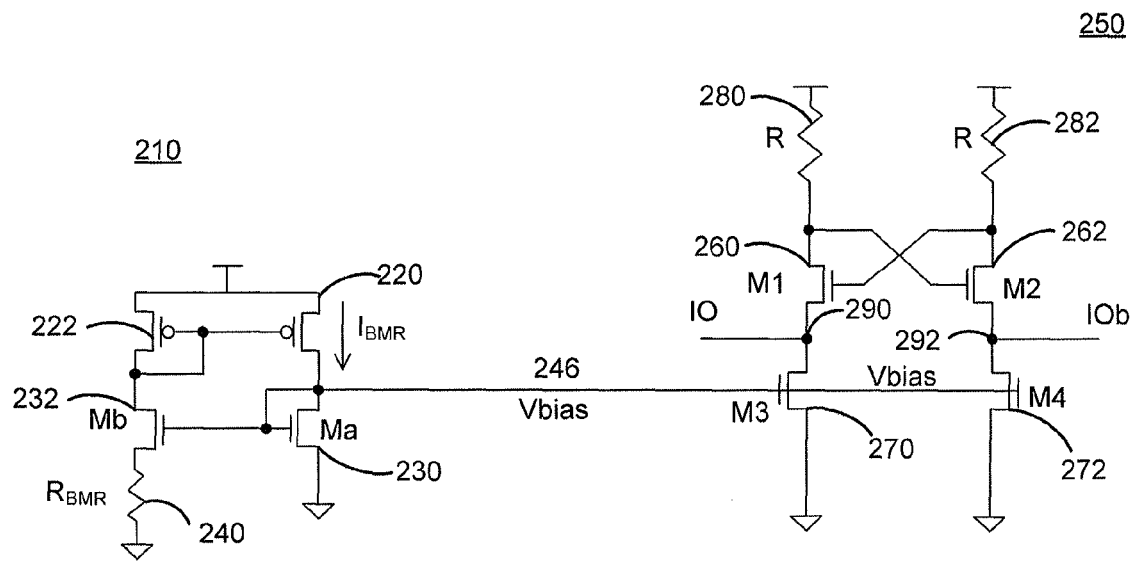
FIG. 3 is a schematic illustration of a sense amplifier including an example bias circuit and amplifier stage.

FIG. 3 is a schematic illustration of a sense amplifier including an example bias circuit and amplifier stage. A bias circuit 210 may be used for the bias circuit 202 of the amplifier 200 of FIG. 2. One example of a bias circuit 210 is a beta multiplier reference (BMR) circuit. The bias circuit 210 includes a pair of transistors 220, 222, such as p-FET transistors, having gates coupled together and sources coupled to receive reference voltage Vcc. The transistor 222 is coupled so that the gate is coupled to its drain. The bias circuit 210 further includes a pair of transistors 230, 232, such as n-FET transistors having the respective gates coupled to each other. One of the transistors 230 has a gate coupled to its drain and a source coupled to a reference voltage, such as ground. A resistance 240 having a magnitude $R_{BMR}$ is coupled to the source of the transistor 230 and the reference node. A bias voltage Vbias is provided from a node 246.

The loop gain for the bias circuit 210 (e.g., $gm_{230} \cdot R_{240}$), where $gm_{230}$ is the transconductance of transistor 230, may be given as:

$$gm_{230} \cdot R_{240} = 2 \cdot \left(1 - \sqrt{\frac{(W/L)_{230}}{(W/L)_{232}}}\right)$$

As a result, the loop gain for the bias circuit 210 may be constant (e.g., $gm_{230} \cdot R_{240} = 1$) for $(W/L)_{232} = 4 \cdot (W/L)_{230}$ With transistor dimensions of the transistors 230, 232 scaled accordingly, for example, (W/L) ratio for transistor 232 is four times the (W/L) ratio for transistor 230, the bias 210 has a loop gain that is 1, and is substantially constant despite variations in process, voltage, and/or temperature. For example, where the resistance of the resistance 240 is lower due to variation in the fabrication process, the gm increases due to an increased current Ibmr resulting from the lower resistance, and likewise, the Vbias also related to Ibmr changes as well. As a result, the product of gm and R, that is, the loop gain for the bias circuit 210, is kept substantially constant despite the variation in R.

Figure 4:
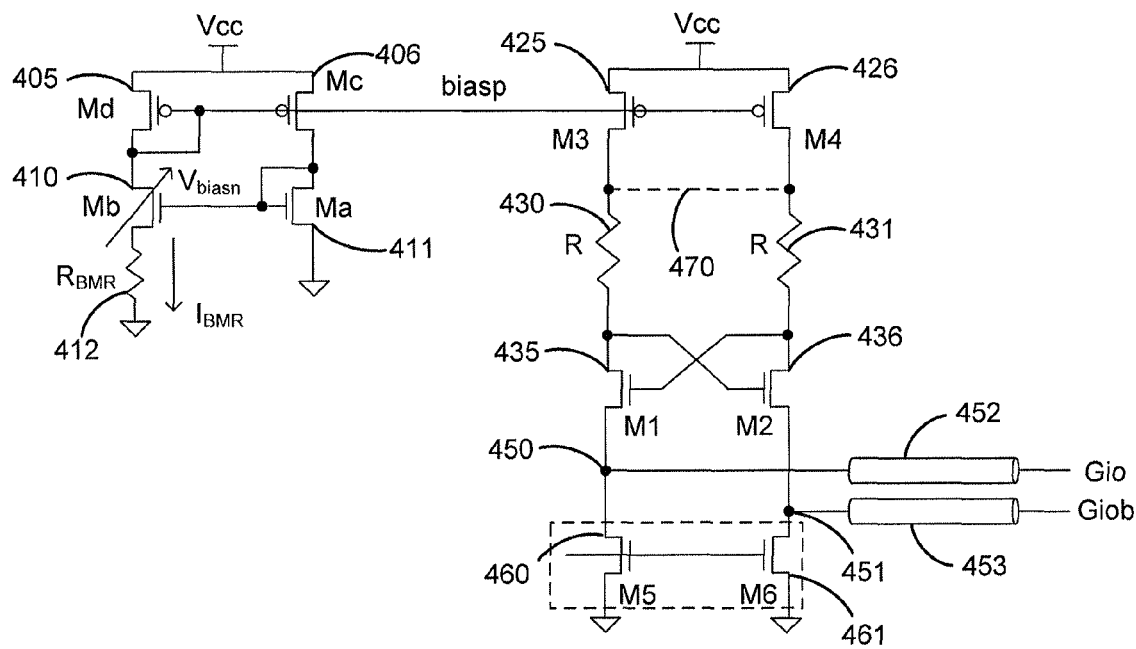
FIG. 4 is a schematic illustration of a sense amplifier in accordance with an embodiment of the present invention.

An example amplifier stage 404 is also illustrated in FIG. 4. The amplifier stage 404 may be used for the amplifier stage 204 of the amplifier 200 of FIG. 2.

An example amplifier stage 250 is also illustrated in FIG. 4. The amplifier stage may be used for the amplifier stage 204 of the amplifier 200 of FIG. 2.

The amplifier stage 250 includes transistors 260, 262, such as n-FET transistors, having gates cross coupled to the drains of the other transistor. Transistors 270, 272 are coupled to sources of the transistors 260, 262, respectively, and have sources coupled to a reference voltage, such as ground. Gates of the transistors 270, 272 are coupled to receive a Vbias voltage from the bias circuit 202. Resistances 280, 282 having magnitudes R are coupled to drains of the transistors 260, 282, respectively, and receive Vcc. The amplifier stage 250 senses and amplifies current at input-output (IO) nodes IO, IOb 290, 292. As known, the loop gain for the amplifier stage 250 for matched transistors 260, 262 and matched resistances 280, 282 is:

$gm_{260} \cdot R_{280} = gm_{262} \cdot R_{282}$

Operation of the amplifier stage 250 will be described with the Vbias provided by the bias circuit 210 of FIG. 3. In some embodiments of the invention, one or more transistor dimensions of the transistors 260, 262, 270, 272 of the amplifier stage 250 are matched to one or more transistor dimensions of transistor 230 of the bias circuit. For example, the (W/L) ratio of transistors 260, 262, 270, 272 can be matched to that of transistor 230. Additionally, in some embodiments the resistances 280, 282 of the amplifier stage are the same magnitude as resistance 240 of the bias circuit. As a result of the matching of transistors 260, 262, 270, 272 to transistor 230 and matched resistance magnitude of resistances 280, 282 with resistance 240, the loop gain of the amplifier stage and the bias circuit are matched. For embodiments having the transistors of the bias circuit scaled to provide a loop gain of 1, for example, the (W/L) of transistor 232 is equal to four times the (W/L) of transistor 230, the loop gain of the amplifier stage 250 will be 1 as well.

With the transistors and resistances matched and Vbias provided to the amplifier stage 250 by a matched bias circuit 210, the loop gain of the amplifier stage 250 will be generally independent of process, voltage, and/or temperature variations. For example, again considering the case where the resistance of the resistance 240 is lower due to variation in the fabrication process, the resistance of the resistances 280, 282 would also be lower since they were subjected to the same variation in the fabrication process. As previously discussed, the Vbias provided by the bias circuit 210 changes as a result of the change in Ibmr due to the lower resistance of the resistance 240. Turning to the amplifier stage, the Vbias voltage from the bias circuit 210 sets the transistors 270, 272 (which are matched to transistor 230 of the bias circuit 210) to the same bias condition of transistor 230. This in turn adjusts the bias current of the amplifier stage 250 in the same manner Ibmr of the bias circuit 210 was altered by the lower resistance of the resistance 240. As a result, the gm of the amplifier stage 250 may increase (as it did for the bias circuit 210) due to the increased bias current to compensate for the decreased R of resistances 280, 282 and the loop gain of the amplifier stage 250 may remain substantially constant despite the variation in R. Generally the Vbias voltage can be used to change the bias current of the amplifier stage, which in turn changes the gm of the amplifier stage. As a result, the loop gain (e.g., gm·R) may be controlled by adjusting the Vbias voltage, for example, to be substantially constant. In this manner, the bias circuit may be configured to provide a bias voltage having a magnitude that is configured to maintain a substantially constant loop gain.

In some embodiments, the transistors 260, 262, 270, 272 and resistances 280, 282 are not matched to transistors 230, 232 and resistance 240, as previously described. For example, transistors 260, 262 and transistors 270, 272 may be designed (e.g., scaled) to provide transconductances k times the transconductance of transistor 230 of the bias circuit 210, and the magnitude of the resistances 280, 282 are (1/k) times the magnitude of resistance 240 of the bias circuit 210. Although the transistors are not matched, the amplifier stage 250 has a loop gain substantially equal to the loop gain of the bias circuit, that is, 1. In some embodiments, the transistors 260, 262, 270, 272 and resistances 280, 282 are designed to provide a amplifier stage having a loop gain other than 1. For example, where the loop gain of the amplifier stage 250 is greater than 1, the amplifier stage exhibits a latch circuit behavior.

In the embodiment shown in FIG. 3, the input/output of the amplifier stage 250 (e.g. nodes IO and IOb) may be biased to a particular non-zero analog voltage level for proper operation. In other words, a particular analog voltage may be needed at nodes IO and IOb such that the current through transistors 270, 272 is substantially equal to $I_{BMR}$ through the transistor 220 for constant loop gain as generally described above. Because the input/output of the amplifier stage 250 may be coupled to relatively long lines for sensing one or more memory cells, there may be capacitive loading at the input/output. Accordingly, placing the input/output at a particular analog voltage level may require a significant amount of time to charge the nodes to the appropriate voltage and/or an analog level generator may be required in some embodiments.

Sense amplifiers in accordance with embodiments of the present invention may allow the input/output of an amplifier stage to be precharged to a reference voltage, such as a supply voltage, which may be preferable over an intermediate analog voltage. FIG. 4 is a schematic illustration of a sense amplifier in accordance with an embodiment of the present invention. The sense amplifier 400 includes a bias circuit 402 and an amplifier stage 404. The bias circuit 402 includes two p-FET transistors 405, 406 having their gates coupled together and coupled to a reference voltage, e.g. V. The reference voltage may be a supply voltage generated by a voltage supply. The transistor 405 has its gate and drain coupled together. The bias circuit 402 also includes n-FET transistors 410, 411. The drain of the transistor 410 is coupled to the drain of the transistor 405. The drain of the transistor 411 is coupled to the drain of the transistor 406. The transistors 410 and 411 are coupled at their gates. The transistor 411 has its gate coupled to its drain. A resistance $R_{BMR}$ 412 is coupled between the transistor 410 and a reference voltage, e.g. ground. The resistance 412 is shown as a resistor, but any resistive element may be used.

In an analogous manner as described above, a current $I_{BMR}$ may accordingly be provided in the transistors 405 and 410 and mirrored to the transistors 406 and 411. The bias circuit may be configured to provide a substantially constant loop gain. A bias voltage biasp may be provided to the amplifier stage 404 from the gates of the p-FET transistors 405, 406. This may be in contrast to the circuit described above with reference to FIG. 3, where a bias voltage Vbias was provided by the n-FET transistors of the bias circuit 210. Moreover, the transistor 410 may have an adjustable width which may be manually or dynamically adjustable, as shown, and as will be described further below.

In this manner, a bias voltage biasp may be provided to the amplifier stage 404. The amplifier stage 404 may include p-FET transistors 425, 426. The bias transistors 425 and 426 have their gates coupled together and are coupled to a reference voltage, e.g. $V_{CC}$. In some embodiments, one p-FET transistor may be used in place of the two bias transistors 425, 426. Resistances 430, 431 are coupled to the drains of bias transistors 425, 426, respectively. Cross-coupled n-FET transistors 435, 436 are coupled to the resistances 430, 431. The gate of the transistor 436 is coupled to the resistance 430, while the gate of the transistor 435 is coupled to the resistance 431. The drain of the transistor 435 is coupled to the resistance 430. The drain of the transistor 436 is coupled to the resistance 431. The source of the transistor 435 is coupled to an input/output of the sense amplifier 404 (node 450). The source of the transistor 436 is coupled to another input/output of the sense amplifier 404 (node 451). As mentioned above, the input/outputs may be coupled to relatively long lines Gio/Giob 452, 453. In some embodiments, the nodes 450, 451 are coupled to a reference voltage, e.g. ground. In some embodiments, the nodes 450, 451 are coupled to the reference voltage through n-FET transistors 460, 461 are coupled to the nodes 450, 451. The amplifier stage 404 may also be configured to provide a substantially constant loop gain. As mentioned above, the bias circuit may be configured to provide a bias voltage having a magnitude that is configured to maintain a substantially constant loop gain.

Generally, the resistances 430 and 431 may be equal to the resistance 412. Transistor dimensions of the transistors 435 and 436 may be equal to transistor dimensions of the transistor 411. For example, the widths of transistors 435 and 436 may be equal to the width of the transistor 411. The widths of bias transistors 425 and 426 may be equal to the widths of the transistors 405 and 406. Recall that the width of the transistor 410 may be adjustable. The width of the transistor 410 may be an integer multiple, K, of the width of the transistor 411. The current $I_{BMR}$ is generated such that $g_m$ of transistor 411 multiplied by $R_{BMR}$ may be given as $$g_{m411} R_{BMR} = 2\left(1 - \frac{1}{\sqrt{K}}\right);$$

where K is the width ratio of transistor 410 to that of 411. In this manner, the loop gain of the bias circuit (e.g. $g_{m411}R_{BMR}$ product) may depend on K, and not on process, voltage, or temperature variation. Where K=4, $g_{m411}R_{BMR}$=1. Accordingly, K=4 may be used in some embodiments. In other embodiments K=1, 2, 3, 5, 6, or 7 may be used. Other values of K may also be used. The biasp voltage is provided to the amplifier stage 404 such that a current based on $I_{BMR}$ is also provided in the legs of the amplifier stage 404 and the loop gain of the amplifier stage (e.g. $g_m$ of the transistor 435 or 436 multiplied by the resistance 430 or 431) is also $$2\left(1 - \frac{1}{\sqrt{K}}\right).$$

Provided the voltages at nodes 450, 451 are sufficiently low, the current in the legs of the amplifier stage 404 should also be $I_{BMR}$ due to current mirroring. The $g_m$ of 435 or 436 multiplied by the resistance of 430 or 431 may accordingly also be substantially constant, 1 in some embodiments. In some embodiments, different multiples may be used. For example, the transistor 425 may have a width 2 times that of the transistor 411, while the resistances 430, 431 may be ½ $R_{BMR}$. Then, the $g_m$ of 435 or 436 (e.g. 2/$R_{BMR}$) multiplied by the resistance of 430 or 431 (e.g. ½ $R_{BMR}$) may still be substantially constant. Other multiples may be used, generally where the width of transistors 425 and 426 are N times a width of the transistor 411, the resistances 430 and 431 are 1/N the resistance of the resistance 412 ($R_{BMR}$).

The bias transistors 425 and 426 may also have their drains connected together. Connecting the drains, such as by including the short 470 may ensure that the load provided to the transistors 435, 436 is simply the resistance of the resistor 430, 431, respectively. If the short 470 is not included, the load resistance would include the resistance of the bias transistors 425, 426, which may be too large for desirable operation. Accordingly, the drains of the bias transistors 425, 426 may be coupled together. In some embodiments, a single transistor may be used in place of the bias transistors 425, 426. The single transistor may be twice as wide as one of the bias transistors 425, 426 in some embodiments. While a hardwired short 470 is shown in FIG. 4, the connection between the drains of the bias transistors 425, 426 may be controlled, e.g. with switches. In some examples, switches may be provided to implement the short 470 responsive to one or more control signals, an embodiment of which will be described further below.

Figure 5:
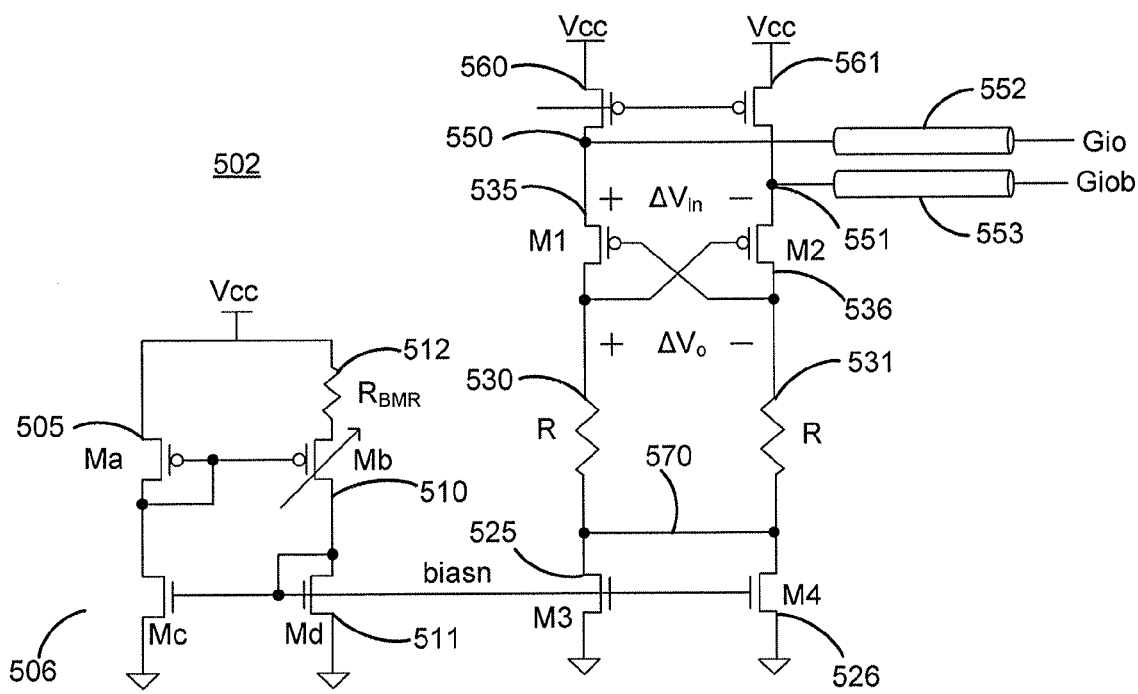
FIG. 5 is a schematic illustration of a sense amplifier in accordance with another embodiment of the present invention.

FIG. 5 is a schematic illustration of a sense amplifier in accordance with another embodiment of the present invention. The sense amplifier 500 includes a bias circuit 502 and an amplifier stage 504. The sense amplifier 500 is analogous to the sense amplifier 400 of FIG. 4, except the sense amplifier 500 is a complementary version using n-FET transistors 525 and 526 to receive a bias voltage from the bias circuit 502 and p-FET cross-coupled transistors 535 and 536 to precharge input/outputs 550, 551 to a reference voltage, e.g. $V_{CC}$.

The bias circuit 502 includes a resistance 512 $R_{BMR}$. The transistor 510 may have an adjustable width, and may be K times a width of the transistor 505. The transistors 506 and 511 provide a bias, biasn, at the gates of the transistors 506 and 511 to the amplifier stage 504. n-FET bias transistors 525, 526, which may have a same width as the transistors 506, 511, receive the biasn signal and provide currents in the respective legs of the amplifier stage 504. As was described above, drains of the bias transistors 525, 526 may be shorted together using a short 570 to reduce a resistance seen by the cross-coupled transistors 535, 536. In some embodiments, a single wider transistor may be used in place of the two bias transistors 525, 526. The resistances 530, 531 may each equal the resistance $R_{BMR}$ in some embodiments. As was described above, a $g_m R_{BMR}$ product may be substantially constant over process, voltage, and temperature variation.

The input/outputs 550, 551 may accordingly be precharged to a reference voltage, e.g. Vcc. The input/outputs 550, 551 may be coupled to relatively long conductive lines 552, 553. It may be advantageous to charge the relatively long conductive lines 552, 553 to a reference voltage, e.g. $V_{CC}$ rather than an intermediate analog voltage.

Figure 6:
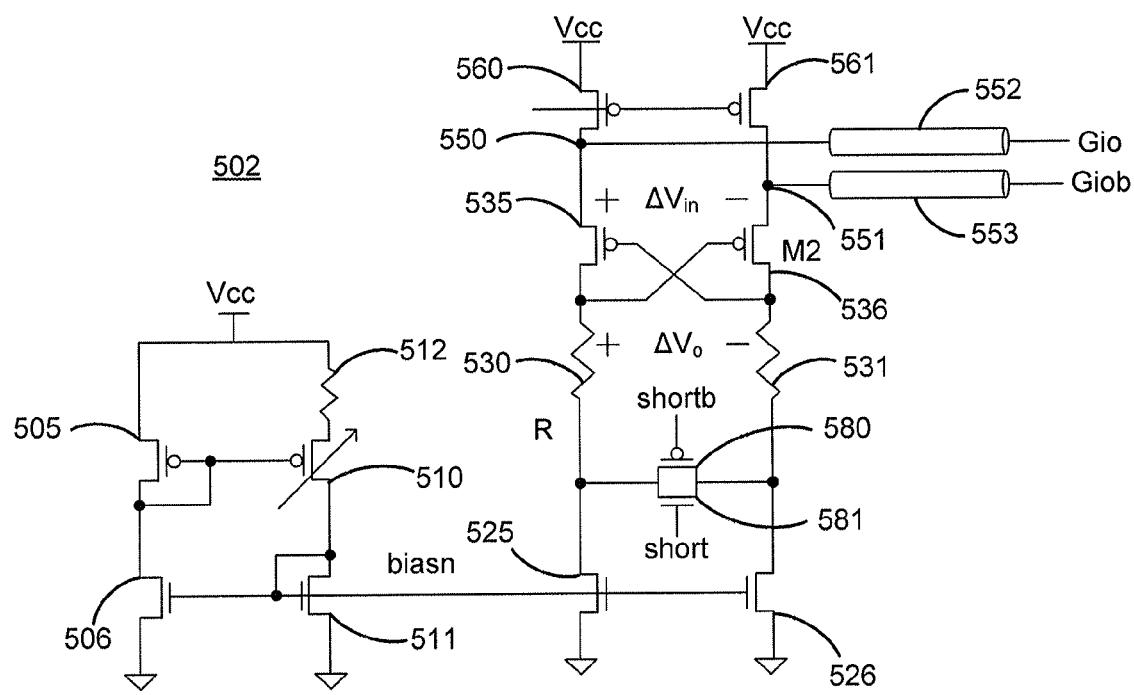
FIG. 6 is a schematic illustration of a sense amplifier in accordance with another embodiment of the present invention.

FIG. 6 is a schematic illustration of a sense amplifier in accordance with another embodiment of the present invention. The sense amplifier 600 includes the same elements shown in the sense amplifier 500 of FIG. 5, which will not be described further here, however, the bias transistors 525 and 526 are connected at their drains by a pair of switches 580, 581. The switches 580, 581 may be closed responsive to respective complementary control signals short and shortb. In this manner, the connection between the drains of the bias transistors 525 and 526 may be controlled by, e.g. a memory controller that may provide the control signals short and shortb. When closed, the short may reduce the resistance seen by the cross-coupled transistors 535, 536, and the amplifier stage 504 may operate with a substantially constant $g_m R$ as described above. When open, the resistance seen by the cross-coupled transistors 535, 536 may be increased by the resistance provided by the bias transistors 525, 526. The increased resistance may allow the amplifier stage 504 to operate as a flip-flop circuit.

Any structure or method may be used to provide the adjustable width transistors described above with reference to FIGS. 4-6. For example, a number of transistors may be provided along with switches to couple to the transistors in parallel. By controlling the switches, a number of transistors may be coupled in parallel to make up the effective adjustable width transistor, such as the transistor 410 or 510 described above. The switches may be set dynamically or statically. For example, the switches may be implemented as fuses or other one-time connections. In other examples, the switches may be logic gates that may be operated in accordance with control signals. In this manner, the width of the effective transistor, e.g. transistor 410 or 510, may be changed during operation or between operations of the sense amplifiers described above. Accordingly, the width of adjustable transistors, e.g. 'K', may be changed at manufacture or may be changed dynamically.

As generally described above, embodiments of sense amplifiers described herein may have substantially constant $g_m R$ products, which may be unity in some embodiments. In practice, however, the $g_m R$ product associated with a sense amplifier may vary as a reference voltage, e.g. $V_{CC}$ varies, due to circuit non-idealities such as, but not limited to, channel length modulation or short channel effect. For a given K value, the $g_m R$ product may increase with increasing $V_{CC}$. In some embodiments, one K value may be used at a lower $V_{CC}$ value and a different K value used at a higher $V_{CC}$ value. That is, when Vcc is at or below a threshold, a lower K may be used than when $V_{CC}$ is above a threshold. In one example, the threshold may be 1V.

Figure 7:
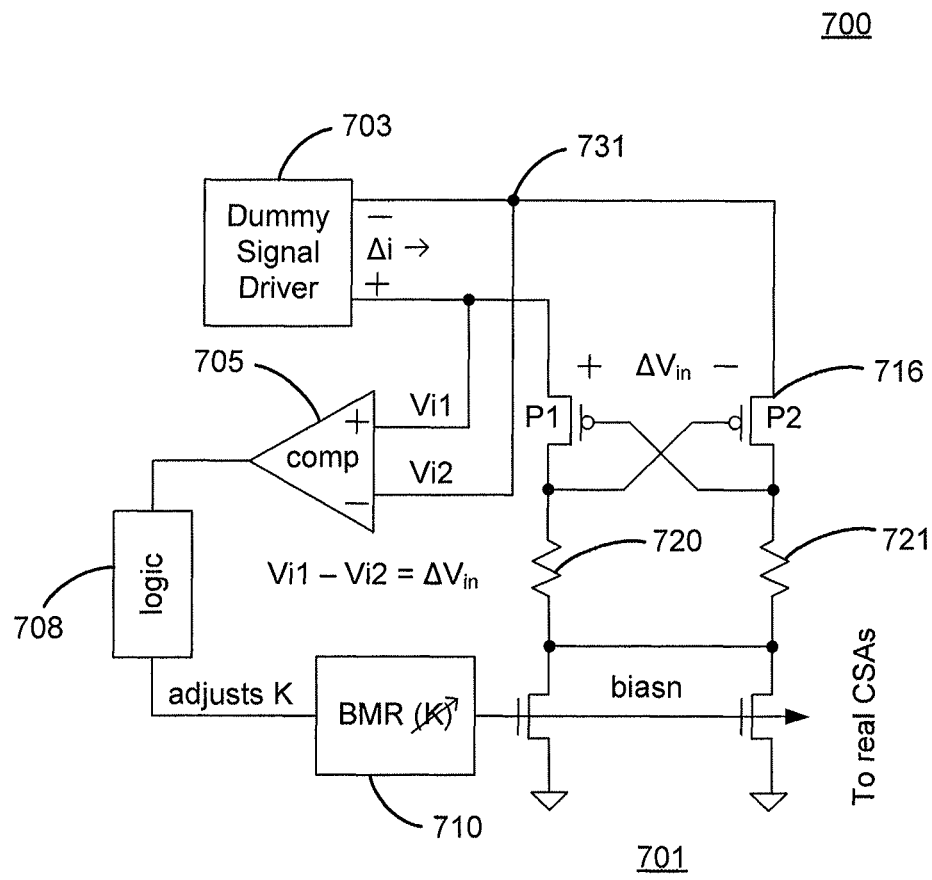
FIG. 7 is a schematic illustration of a circuit for calibrating a width of a transistor according to an embodiment of the present invention.

FIG. 7 is a schematic illustration of a circuit for calibrating a width of a transistor according to an embodiment of the present invention. The circuit 700 includes a dummy amplifier stage 701, a dummy signal driver 703, a comparator 705, and logic 708. The circuit 700 may provide a control signal to a bias circuit 710 to adjust the width (e.g. 'K') of a transistor. The bias circuits described above, e.g. bias circuit 402 or 502, may be used as the bias circuit 710 of FIG. 7. Components of the dummy amplifier stage 701 may be selected to match the components of an amplifier stage to be used in a sense amplifier, such as the amplifier stages 404 or 504 of FIGS. 4 and 5. The dummy amplifier stage 702 includes cross-coupled p-FET transistors 715, 716 and resistances 720, 721. n-FET transistors 725, 726 are coupled to the resistances 720, 721, respectively, and receive a bias signal, biasn, from the bias circuit 710. The drains of the n-FET transistors 725, 726 may be shorted together, as also described above.

The dummy signal driver 703 is coupled to the transistors 715, 716. The dummy signal driver 703 may provide a differential current to the transistors 715, 716. In this manner, a differential voltage may be generated at nodes 730, 731. The differential voltage may be provided to the comparator 705 that may provide an output signal indicative of the differential voltage to the logic 708. Based on the output signal, the logic 708 may provide a control signal to the bias circuit 710 to change a width of an adjustable transistor in the bias circuit 710. The control signal may be provided to change the width of the adjustable transistor to reduce the voltage difference generated at the nodes 730 and 731 responsive to the input current difference. The control signal provided by the logic 708 may include, for example, a control signal to open a particular number of switches to connect a number of transistors in parallel to provide an effective transistor of a particular width. In some examples, ideally, no voltage difference may ultimately be generated responsive to an input differential current, corresponding to an effective 0 input resistance to the dummy amplifier stage 702. The bias voltage, e.g. biasn, may be provided to other amplifier stages for use by sense amplifiers, e.g. the amplifier stages 404 or 504 of FIG. 4 or 5. In this manner, the low or 0 input resistance condition may be replicated at the other amplifier stages.

Figure 8:
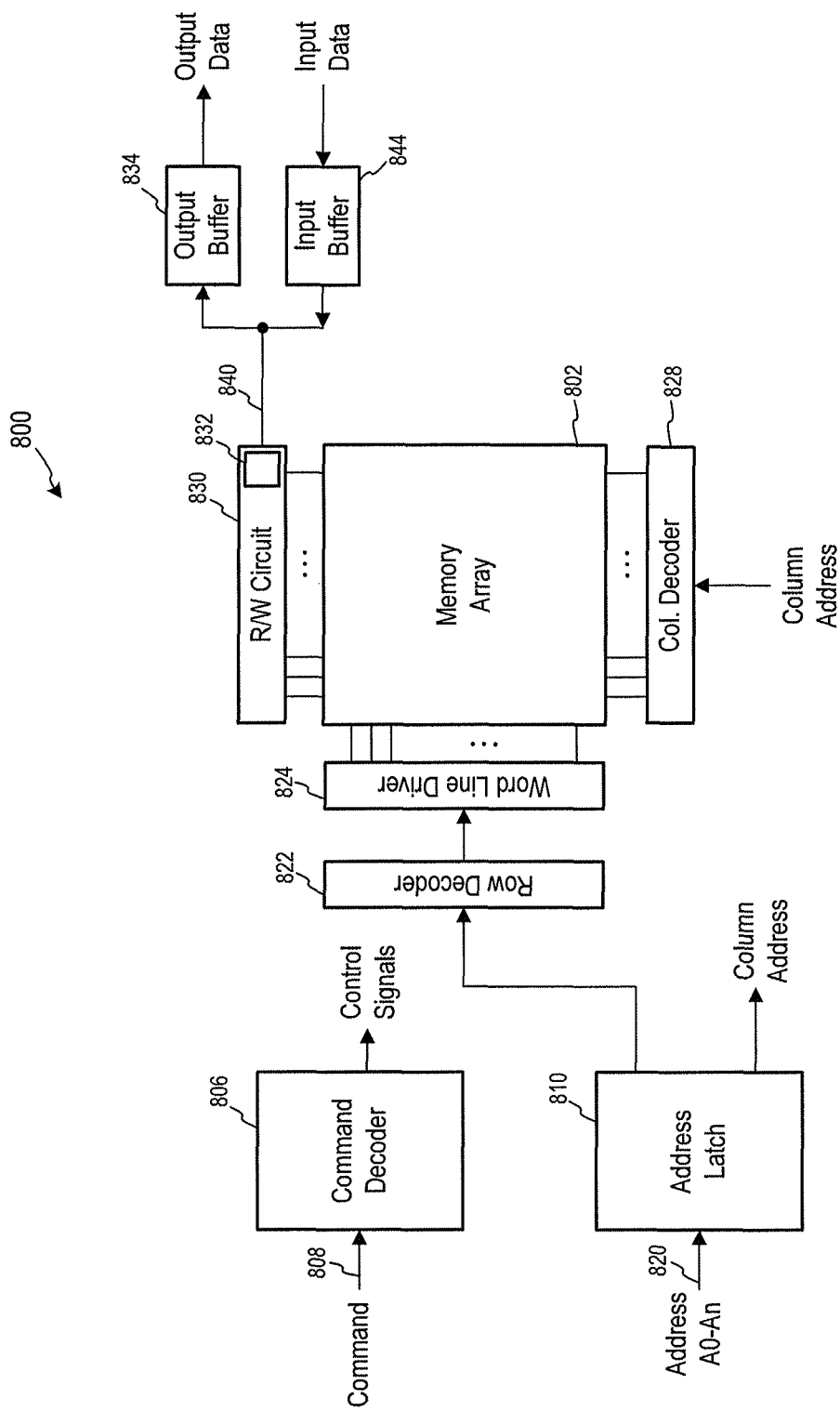
FIG. 8 is a block diagram of a memory including a current amplifier according to an embodiment of the invention.

FIG. 8 is a schematic illustration of a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a command decoder 806 that receives memory commands through a command bus 808 and generates corresponding control signals within the memory 800 to carry out various operations. For example, the command decoder 806 responds to memory commands applied to the command bus 808 to perform various operations on the memory array 802. In particular, the command decoder 806 is used to generate internal control signals to read data from and write data to the memory array 802. Row and column address signals are applied to the memory 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output buffer 834 via an input-output data bus 840. Write data are applied to the memory array 802 through a data input buffer 844 and the memory array read/write circuitry 830. The read/write circuitry 830 includes at least one sense amplifier 832 according to an embodiment of the invention. Read data and write data provided to the read/write circuitry 830 is transmitted over input-output lines and are amplified by the sense amplifier 832 to be provided to the output buffer 834 and before being written to the memory array 802. The sense amplifier 832 may be implemented by any of the embodiments of sense amplifiers described herein.

The portion of the memory device shown in FIG. 8 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of sense amplifiers described herein to perform their ultimate user function.

From the foregoing it will be appreciated that, although specific embodiments of the invention have been described herein for purposes of illustration, various modifications may be made without deviating from the spirit and scope of the invention.

What is claimed is:

1. A sense amplifier, comprising
    a bias circuit including an adjustable transistor, wherein the adjustable transistor includes a dimension that is adjustable, wherein the bias circuit is configured to provide a bias voltage having a magnitude that is based, at least in part, on a size of the dimension of the adjustable transistor and is configured to maintain a substantially constant loop gain; and
    an amplifier stage coupled to the bias circuit to receive the bias voltage and configured to bias an input-output node to a reference voltage, the amplifier stage having a loop gain controlled at least in part by the bias voltage.

2. The sense amplifier of claim 1 wherein the bias circuit comprises a beta multiplier reference circuit.

3. The sense amplifier of claim 1 wherein the bias circuit comprises:
    a first pair of transistors including the adjustable transistor having gates coupled together, a transistor of the first pair of transistors other than the adjustable transistor having a gate coupled to its drain;
    a second pair of transistors having gates coupled together, a first transistor of the second pair of transistors having a gate coupled to its drain and a bias voltage output node from which the bias voltage is provided; and
    a resistance coupled to a second transistor of the first pair of transistors coupled to its drain.

4. The sense amplifier of claim 3, wherein the adjustable transistor has an adjustable width.

5. The sense amplifier of claim 4, wherein the loop gain is controlled at least in part by a ratio of the adjustable width to a width of the adjustable transistor of the first pair of transistors.

6. The sense amplifier of claim 1, wherein the amplifier stage comprises:
    a pair of cross-coupled transistors;
    a bias transistor coupled to the pair of cross-coupled transistors and further configured to receive the bias voltage from the bias circuit;
    a pair of resistances, each of the pair of resistances coupled between a respective one of the pair of cross-coupled transistors and the bias transistor, the loop gain of the current amplifier stage matching a loop gain of the bias circuit.

7. The sense amplifier of claim 6, wherein the bias transistor comprises a pair of bias transistors, wherein the pair of bias transistors are coupled together at their sources or drains.

8. The sense amplifier of claim 6, wherein the bias transistor comprises a pair of bias transistors, wherein the pair of bias transistors are coupled together at their sources or drains through switches.

9. The sense amplifier of claim 6, wherein the bias transistor comprises a pair of bias transistors, wherein the pair of bias transistors comprise p-FET transistors and the reference voltage comprises ground.

10. The sense amplifier of claim 6, wherein the bias transistor comprises a pair of bias transistors, wherein the pair of bias transistors comprise n-FET transistors and the reference voltage comprises a positive supply voltage.

11. The sense amplifier of claim 6, wherein the input/output node comprises a pair of input/output nodes, and wherein the pair of transistors are coupled to the pair of input/output nodes.

12. The sense amplifier of claim 6, wherein the bias transistor of the amplifier stage has transistor dimensions that are the same as dimensions of the adjustable transistor.

13. The sense amplifier of claim 1 wherein the amplifier stage and bias circuit are configured to have the same loop gain.

14. A circuit for calibrating a width of a transistor, the circuit comprising:
    a signal driver configured to provide a differential current;
    an amplifier stage configured to receive the differential current and provide a differential voltage responsive to the differential current;
    a bias circuit coupled to the amplifier stage and configured to provide a bias voltage to the amplifier stage, wherein the bias voltage is configured for substantially constant loop gain, wherein the bias circuit includes an adjustable width transistor;
    logic coupled to the bias circuit and configured to adjust a width of the transistor based, at least in part, on the differential voltage.

15. The circuit of claim 14, wherein the logic is configured to adjust the width of the transistor to reduce the differential voltage.

16. The circuit of claim 14, wherein the amplifier stage comprises:
    a pair of cross-coupled transistors;
    a bias transistor coupled to the pair of transistors and further configured to receive the bias voltage from the bias circuit;
    a pair of resistances, each coupled between a respective one of the pair of cross-coupled transistors and the bias transistor, the loop gain of the current amplifier stage matching a loop gain of the bias voltage circuit.

17. The circuit of claim 16, wherein the bias transistor comprises a pair of bias transistors, wherein the pair of bias transistors coupled together at their respective sources or drains.

18. The circuit of claim 14, wherein the adjustable width transistor comprises a plurality of transistors and switches configured to couple a selected number of the plurality of transistors in parallel.

19. The circuit of claim 18, wherein the logic is configured to activate a number of the switches to couple a selected number of the plurality of transistors in parallel, wherein the selected number is based, at least in part, on the differential voltage.

20. The circuit of claim 18, further comprising a comparator coupled to the amplifier stage and configured to provide a signal to the logic indicative of the differential voltage.

21. A sense amplifier, comprising
a bias circuit including an adjustable transistor, wherein the adjustable transistor includes a dimension that is adjustable, wherein the bias circuit is configured to provide a bias voltage having a magnitude based, at least in part, on a size of the dimension of the adjustable transistor and configured to maintain a constant loop gain; and
an amplifier stage coupled to the bias circuit to receive the bias voltage and having a loop gain controlled, at least in part, by the bias voltage.

22. The sense amplifier of claim 21 wherein the bias circuit comprises:
a first pair of transistors including the adjustable transistor having gates coupled together, the transistor of the first pair of transistors other than the adjustable transistor having a gate coupled to its drain;
a second pair of transistors having gates coupled together, one of the second pair of transistors having a gate coupled to its drain and a bias voltage output node from which the bias voltage is provided; and
a resistance coupled to the adjustable transistor of the first pair of transistors.

23. The sense amplifier of claim 22, wherein the adjustable transistor has an adjustable width.

24. The sense amplifier of claim 23, wherein the loop gain is controlled at least in part by a ratio of the adjustable width to a width of the other transistor of the first pair of transistors.

25. The sense amplifier of claim 21, wherein the amplifier stage comprises:
a pair of cross-coupled transistors;
a bias transistor coupled to the pair of cross-coupled transistors and further configured to receive the bias voltage from the bias circuit; and
a pair of resistances, each of the pair of resistances coupled between a respective one of the pair of cross-coupled transistors and the bias transistor, the loop gain of the current amplifier stage matching a loop gain of the bias circuit.

* * * * *